US009153554B2

(12) United States Patent
Brunner

(10) Patent No.: US 9,153,554 B2
(45) Date of Patent: Oct. 6, 2015

(54) METHODS OF ADJUSTING ULTRASONIC BONDING ENERGY ON WIRE BONDING MACHINES

(71) Applicant: Kulicke and Soffa Industries, Inc., Fort Washington, PA (US)

(72) Inventor: Jon W. Brunner, Sellersville, PA (US)

(73) Assignee: Kulicke and Soffa Industries, Inc., Fort Washington, PA (US)

(*) Notice: Subject to any disclaimer, the term of this patent is extended or adjusted under 35 U.S.C. 154(b) by 0 days.

(21) Appl. No.: 13/860,022

(22) Filed: Apr. 10, 2013

(65) Prior Publication Data

US 2013/0277414 A1 Oct. 24, 2013

Related U.S. Application Data

(60) Provisional application No. 61/636,681, filed on Apr. 22, 2012.

(51) Int. Cl.
*B23K 31/02* (2006.01)
*H01L 23/00* (2006.01)

(52) U.S. Cl.
CPC ............... *H01L 24/45* (2013.01); *H01L 24/85* (2013.01); *H01L 24/78* (2013.01); *H01L 2224/45* (2013.01); *H01L 2224/48463* (2013.01); *H01L 2224/78301* (2013.01); *H01L 2224/78925* (2013.01); *H01L 2224/85* (2013.01); *H01L 2224/859* (2013.01); *H01L 2224/85045* (2013.01); *H01L 2224/85205* (2013.01); *H01L 2224/85207* (2013.01); *H01L 2924/00014* (2013.01); *H01L 2924/01006* (2013.01)

(58) Field of Classification Search
CPC ............. H01L 2224/85205; H01L 2224/4809; H01L 24/78; H01L 24/85; H01L 2224/859; H01L 2224/78313; H01L 2224/78301; B23K 20/10; B23K 20/004; B23K 11/24; B23K 11/25; B23K 11/252; B23K 31/125; B23K 20/005
USPC .............. 228/180.5, 4.5, 904, 110.1, 1.1, 111
See application file for complete search history.

(56) References Cited

U.S. PATENT DOCUMENTS

| 5,566,876 A | 10/1996 | Nishimaki et al. |
| 2003/0167846 A1* | 9/2003 | Farassat ........................ 73/582 |
| 2007/0062634 A1 | 3/2007 | Evans, Jr. et al. |
| 2007/0065634 A1* | 3/2007 | Sauer ........................... 428/141 |
| 2008/0102539 A1* | 5/2008 | Tong et al. ....................... 438/6 |
| 2012/0074206 A1 | 3/2012 | Qin et al. |

FOREIGN PATENT DOCUMENTS

CN 102420150 4/2012

* cited by examiner

*Primary Examiner* — Erin Saad
(74) *Attorney, Agent, or Firm* — Stradley Ronon Stevens & Young LLP

(57) ABSTRACT

A method of adjusting ultrasonic bonding energy on a wire bonding machine, the method comprising the steps of: providing a reference relationship between free air ball squash and ultrasonic bonding energy; determining an actual relationship between free air ball squash and ultrasonic bonding energy on a subject wire bonding machine; and adjusting at least one ultrasonic bonding energy setting of the subject wire bonding machine such that the actual relationship of the subject wire bonding machine is closer to the reference relationship.

21 Claims, 7 Drawing Sheets

METHODS OF ADJUSTING ULTRASONIC BONDING ENERGY ON WIRE BONDING MACHINES

CROSS-REFERENCE TO RELATED APPLICATION

This application claims the benefit of U.S. Provisional Application No. 61/636,681, filed Apr. 22, 2012, the contents of which are incorporated herein by reference.

FIELD OF THE INVENTION

The present invention relates to the formation of wire bonds, and more particularly, to improved methods of adjusting and/or normalizing ultrasonic bonds between multiple wire bonding machines.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

Due to variations amongst like wire bonding machines, it may be difficult to obtain wire bonds having substantially uniform bonding characteristics (e.g., shear strength, pull strength, etc.) using or employing the same input bonding parameters across the like wire bonding machines. For example, ultrasonic transducers (e.g., including piezoelectric crystal) tend to vary from machine to machine even though they are nominally the same. Thus, even though the same energy (e.g., electrical current) is applied to the various transducers, the output characteristics of the transducers (and the resultant various wire bonds) may vary significantly.

Thus, it would be desirable to provide improved methods of forming consistent wire bonds amongst a plurality of like wire bonding machines.

SUMMARY OF THE INVENTION

According to an exemplary embodiment of the present invention, a method of adjusting (e.g., calibrating, normalizing, etc.) ultrasonic bonding energy on a wire bonding machine is provided. The method comprising the steps of: (1) providing a reference relationship between free air ball squash and ultrasonic bonding energy; (2) determining an actual relationship between free air ball squash and ultrasonic bonding energy on a subject wire bonding machine; and (3) adjusting at least one ultrasonic bonding energy setting of the subject wire bonding machine such that the actual relationship of the subject wire bonding machine is closer to the reference relationship.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Figure 1:
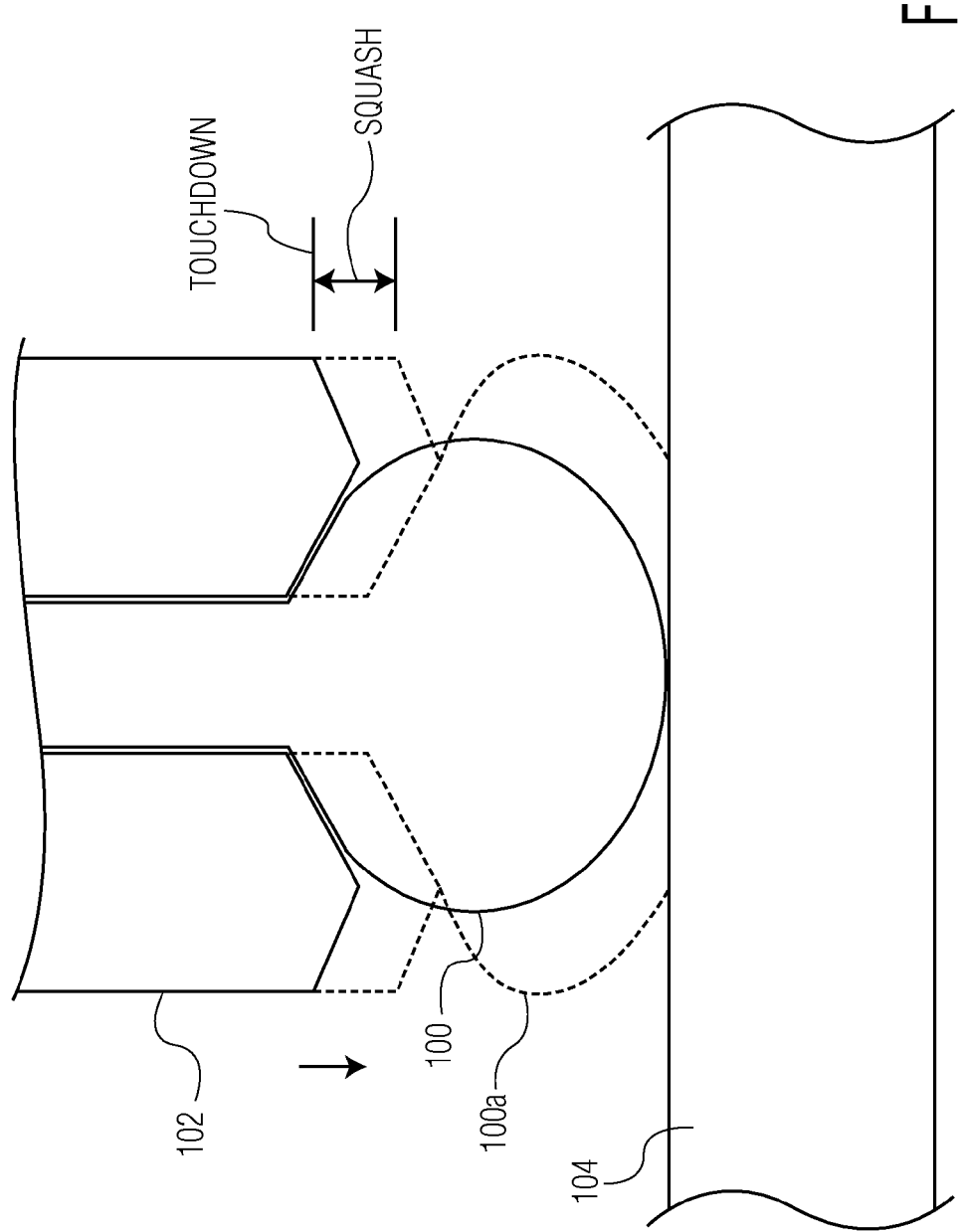
FIG. 1 is a block diagram side view illustrating touchdown of a free air ball against an underlying substrate in accordance with an exemplary embodiment of the present invention.

As used herein, ultrasonic bonding energy refers to energy used by an ultrasonic transducer of a wire bonding machine. Such bonding energy may be provided as electrical current controlled energy (e.g., in controlled increments of milliamps applied to the transducer to achieve ultrasonic vibration of the transducer and thus, the bonding tool), electrical voltage controlled energy, electrical power controlled energy, etc.

In specific exemplary embodiments of the present invention, adjustments to ultrasonic bonding energy setting(s) are made in order to provide wire bonder portability, that is, having consistent bonds across a plurality of wire bonding machines (e.g., where the machines may be of the same model, or of different models). Exemplary ultrasonic bonding energy settings that may be adjusted include, without limitation: an electrical current setting of the current provided to the transducer; an electrical voltage setting of the voltage provided to the transducer; an electrical power setting of the power provided to the transducer; a current factor setting (e.g., a squash based current factor setting); a voltage factor setting (e.g., a squash based voltage factor setting); a power factor setting (e.g., a squash based power factor setting); an ultrasonic bonding energy offset between an actual relationship and a reference relationship; etc. As will be appreciated by those skilled in the art, such factor settings (e.g., current factor settings) may be a factor or variable (e.g., a multiplier, an offset, etc.) applied to the actual setting. Thus, in the case of a current factor setting, the setting may be a multiplier applied to the actual current setting to be provided to the transducer. Such a current factor setting may be useful in allowing a wire bonder user to achieve a substantially similar wire bond using a common current input as such a current factor setting(s) overcomes certain differences from one machine to another (e.g, where the machines are of the same model, or a different model). Such a process may involve a manual adjustment of the ultrasonic bonding energy setting (s), or may be fully automated without the need for external measurements (e.g., shear test measurements, pull test measurements, etc.), thereby increasing the efficiency (and reducing the manpower) of machine to machine calibration adjustments.

The inventive techniques quantify the squash behavior of a free air ball (FAB) under bonding force and ultrasonic energy. The rate and amount of squash, which may be measured with a high-resolution encoder on the z-axis of the wire bonding machine (or using other techniques), are proportional to the level of ultrasonic energy applied. As will be appreciated by those skilled in the art, there is a substantial correlation between free air ball squash and shear strength of a wire bond. Thus, an adjustment/calibration based on squash will substantially normalize shear strength across wire bonding machines.

As explained below, squash level is measured during a time period when ultrasonic energy is applied. In a specific example, touchdown occurs when a free air ball makes physical contact with a bonding location—touchdown may be considered when such physical contact is declared (e.g., using a contact detect system such as electrical conductivity detection, using force detection, using velocity detection, etc.). A bond force is applied after contact is declared, and the link transducer structure relaxes at the steady-state bonding force at a position (e.g., a z-axis position of the wire bonding machine). Then, ultrasonic energy is applied to the free air ball. In this example, squash is measured during a time period (e.g., a predetermined time period) beginning at the application of the ultrasonic energy and ending when the predetermined time period has elapsed.

In accordance with certain exemplary embodiments of the present invention, methods of adjusting (e.g., calibrating, etc.) ultrasonic energy between multiple wire bonding machines are provided. For example, certain inventive methods compare an actual relationship of a subject wire bonding machine (e.g., a correlation between free air ball squash and ultrasonic bonding energy levels on the subject wire bonding machine) to a reference relationship (e.g., a predetermined correlation between free air ball squash and ultrasonic bonding energy levels on a reference wire bonding machine(s)), and adjusts at least one ultrasonic energy setting of the subject wire bonding machine such that the adjusted subject relationship is closer to the reference relationship. This technique permits multiple subject wire bonding machines to be adjusted (e.g., calibrated, normalized, etc.) toward a single reference relationship. The inventive processes tend to have particular benefits in connection with providing wire ball bonds having similar characteristics across a spectrum of subject wire bonding machines (where the machines may, or may not, be the same model), at, for example, a factory floor of wire bonding machines.

Figure 2:
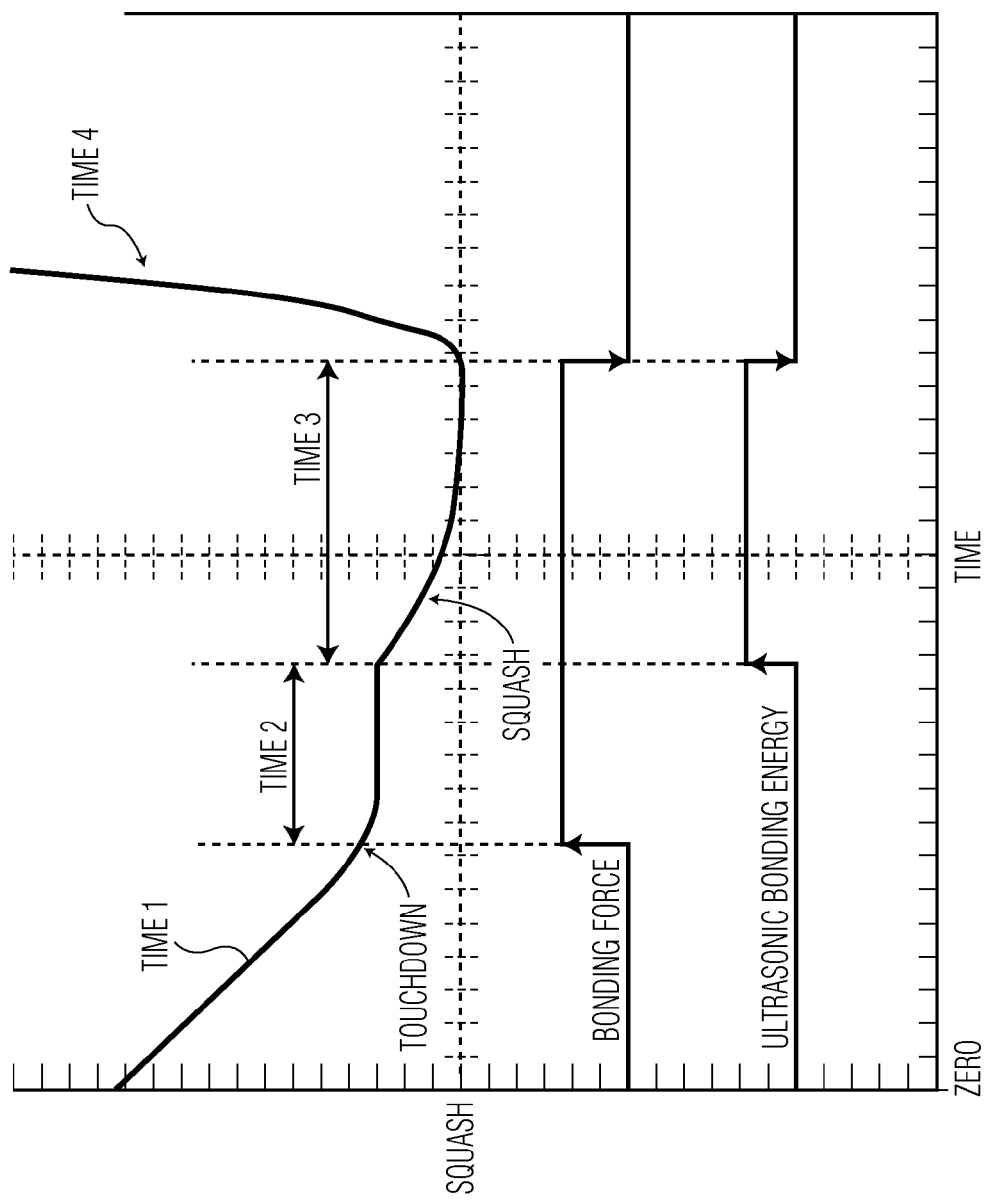
FIG. 2 is timing diagram illustrating free air ball squash versus time in accordance with an exemplary embodiment of the present invention.

FIG. 1 illustrates a side view of free air ball 100 at the lower end of bonding tool 102 (e.g., capillary 102) making contact with bonding location 104 (e.g., a bond pad of a semiconductor die) at touchdown. As will be appreciated by those skilled in the art, a relatively low level of bonding force may be applied such that a substantially steady state may be reached where free air ball 100 is in contact with bonding location 104 as shown in FIG. 1. Then, a level of ultrasonic bonding energy (e.g., provided by electrical current applied to an ultrasonic transducer) is applied and the squash of free ball 100 is measured. Downward motion of bonding tool 102 (resulting in the squash), and actual deformation of free air ball 100 into squashed free air ball 100a, is also shown in dotted lines in FIG. 1. FIG. 2 is an exemplary timing diagram for measuring the free air ball squash.

For example, FIG. 2 is a simplified timing diagram (e.g., as may be obtained from an oscilloscope) of squash versus time at a predetermined level of bond force ("BONDING FORCE") and ultrasonic bonding energy ("ULTRASONIC BONDING ENERGY"). Specifically, the y-axis illustrates vertical (on bonder z-axis) squash movement increments of a bonding tool (e.g., in z-axis encoder count increments), and the x-axis illustrates increments of time (e.g., in milliseconds). Beginning with time "zero" (the farthest to the left on the x-axis), the descent of bonding tool 102 is shown during Time 1, with minimal or no bonding force and no ultrasonic bonding energy. Free air ball 100, which is seated at the tip of bonding tool 102, contacts location 104 (i.e., touchdown of free air ball 100). There are a number of ways to detect this touchdown ("TOUCHDOWN"). For example, this touchdown may be sensed as a completed electrical circuit. In another example, this touchdown may be sensed in connection with a decay in velocity of the free air ball along the z-axis. Following touchdown (regardless of how detected), a predetermined level of bonding force ("BONDING FORCE") is applied (e.g., a relatively low level of bonding force) such that the z-axis position becomes relatively stable during Time 2. Such a stable z-axis position is illustrated by the substantially flat, or horizontal, line during Time 2 where there is little or no squash of free air ball 100. Then, a predetermined amount of ultrasonic bonding energy ("ULTRASONIC BONDING ENERGY") is applied for a predetermined time (Time 3) ("SQUASH"), while the bonding force is maintained. At the end of Time 3, the bonding force and ultrasonic bonding energy are turned off, and the bonding tool is raised during Time 4. During Time 3, the application of ultrasonic energy causes the bonding tool to move down until free air ball 102 is squashed. The amount of this downward movement correlates to the amount of free air ball squash, and may be measured, for example, by a high-resolution encoder on the z-axis. The data corresponding to the squash at the predetermined bonding force and predetermined bonding energy may be saved into a computer for later use in generating a relationship/profile of free air ball squash versus ultrasonic bonding energy for a given wire bonding machine. As will be appreciated by those skilled in the art, other techniques are contemplated for measuring free air ball squash.

The relationship between free air ball squash and the amount of applied ultrasonic bonding energy (e.g., electrical current applied to an ultrasonic transducer) tends to be a linear relationship within a certain range of ultrasonic bonding energy—but as described above the relationship may vary from one wire bonding machine to another wire bonding machine, thus creating portability issues. According to certain exemplary embodiments of the present invention, a reference relationship between free air ball squash and ultrasonic bonding energy is provided. For example, this reference relationship may be a desired, or model, relationship, and may be obtained by measuring the relationship of a plurality of like wire bonding machines, and then extrapolating the reference relationship from the plurality of relationships (e.g., averaging or otherwise mathematically manipulating the multiple relationships to derive a single reference relationship).

Figure 3:
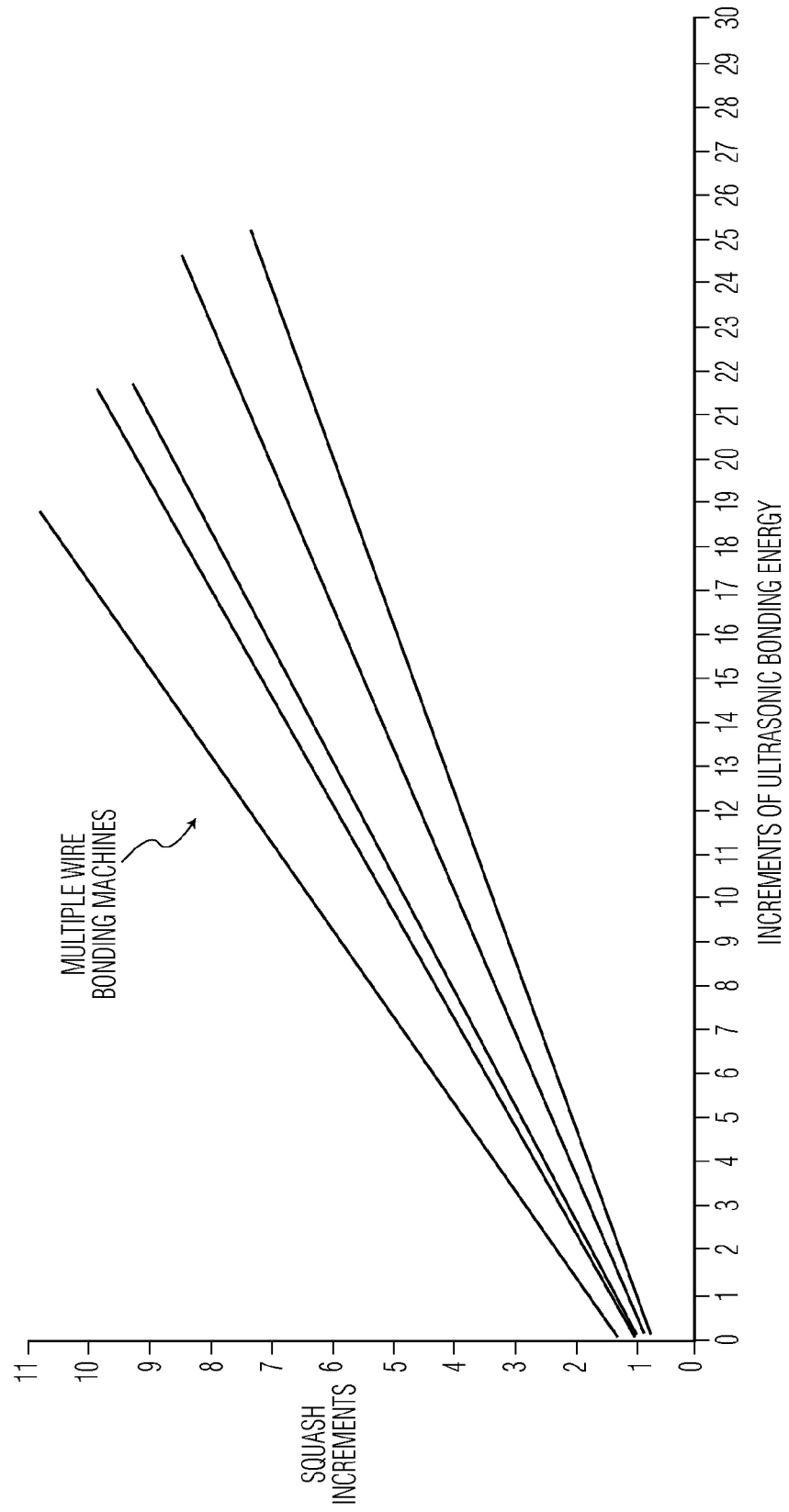
FIG. 3 is a graph of squash increments versus increments of ultrasonic bonding energy for a plurality of wire bonding machines in accordance with an exemplary embodiment of the present invention.

FIG. 3 illustrates the respective actual relationships of a plurality of like wire bonding machines (e.g., of the same model). More specifically, for each wire bonding machine (e.g., where each wire bonding machine may be a known machine that operates within certain acceptable specifications) a relationship is derived. The relationships may be derived by measuring (e.g., using a z-axis encoder as described above with respect to FIG. 2) the z-axis free air ball squash at each of a plurality of levels/increments of ultrasonic energy. As will be appreciated by those skilled in the art, at each data point where the free air ball squash is measured a predetermined bonding force and a predetermined ultrasonic bonding energy may be applied. The predetermined ultrasonic bonding energy may be increased incrementally in a predetermined range (e.g., an active range for the wire bonding machine). In certain embodiments of the present invention, the predetermined bonding force may be static in connection with the relationship, and in other embodiments the predetermined bonding force may be incremented along with the predetermined ultrasonic bonding energy. The ranges of predetermined bonding force and predetermined ultrasonic bonding energy applied to obtain the various squash measurements used to derive the relationships will depend on the wire bonding machine used, the type of ultrasonic transducer used, and various other factors. One exemplary range for the predetermined ultrasonic bonding energy would be 10-100 milliamps. In such an example, the electrical current applied to the ultrasonic transducer may be incremented (e.g., in 30 increments) between 10 milliamps and 100 milliamps. Corresponding increments of bonding force may also be used. The free air ball squash may be measured at each of the increments, and then a relationship for a given wire bonding machine may be provided. This process may be repeated for a number of like wire bonding machines.

For example, FIG. 3 illustrates these relationships (i.e., in the form of respective linear relationships, that is, slopes) for 5 distinct, like wire bonding machines. As described above, each of these 5 linear relationships represents a plurality of squash measurements at increments of ultrasonic bonding energy (e.g., and increments of bonding force). These 5 relationships may be used to establish a single reference relationship. Of course, while 5 relationships are shown in FIG. 3, any number of relationships for any number of like wire bonding machines may be used to establish a desired reference relationship. For example, the slope of each of the relationships may be averaged to determine an average slope—and this average slope may be used as the reference relationship.

Figure 4:
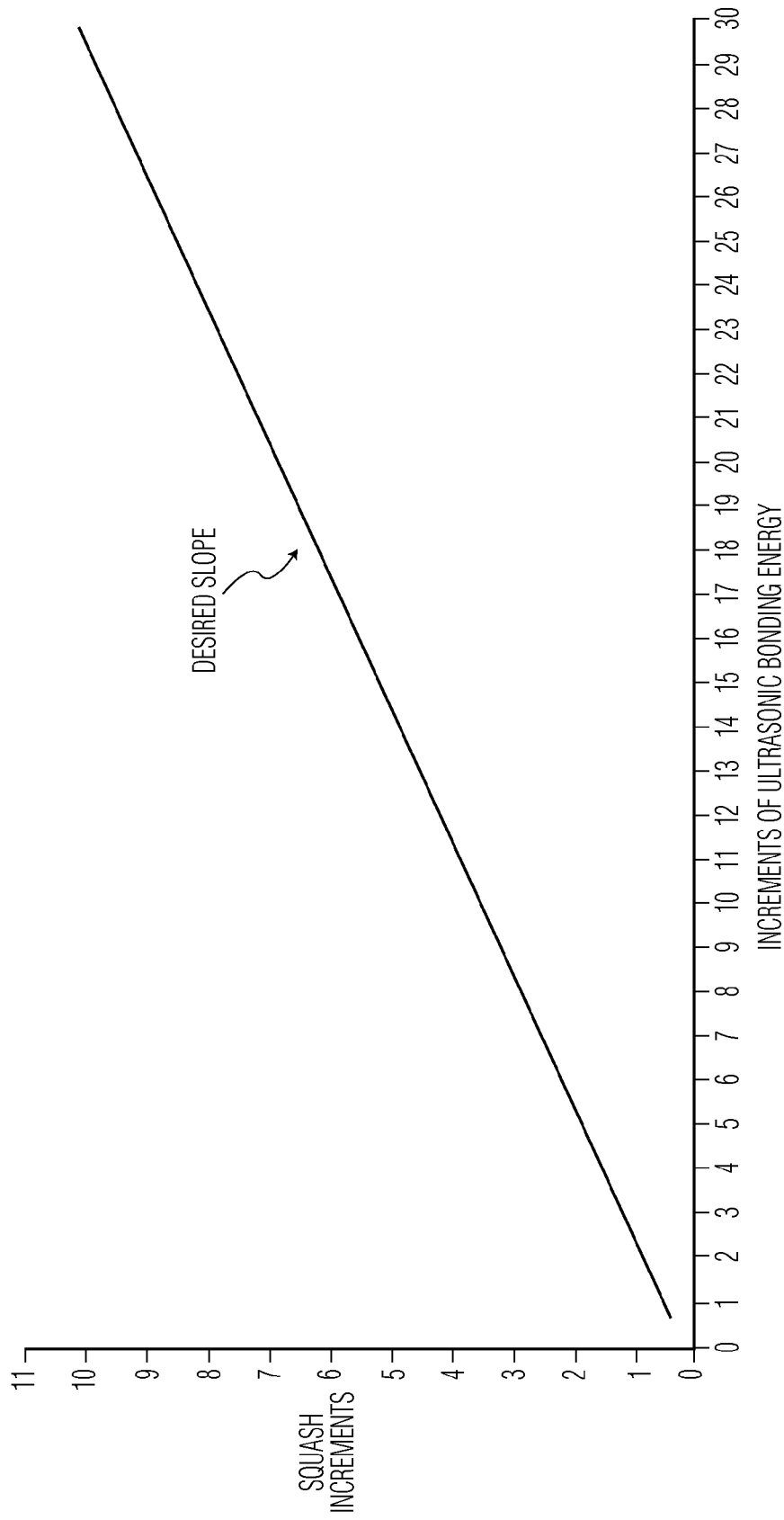
FIG. 4 is a graph of squash increments versus increments of ultrasonic bonding energy illustrated as a reference relationship in accordance with an exemplary embodiment of the present invention.

FIG. 4 illustrates an example reference relationship (e.g., a desired reference slope). As will be appreciated by those skilled in the art, the reference relationship shown in FIG. 4 is not derived using the 5 relationships of FIG. 3. In any event, after the desired reference relationship has been calculated or otherwise provided, a user of a plurality of wire bonding machines that desires wire bonder portability may adjust the respective actual relationship for each wire bonding machine to more closely approximate the reference relationship. By making such an adjustment, the output of each of the adjusted wire bonding machine may more closely approximate the output of the reference relationship, thereby providing the user with improved bonding uniformity across the wire bonding machines.

Figure 5:
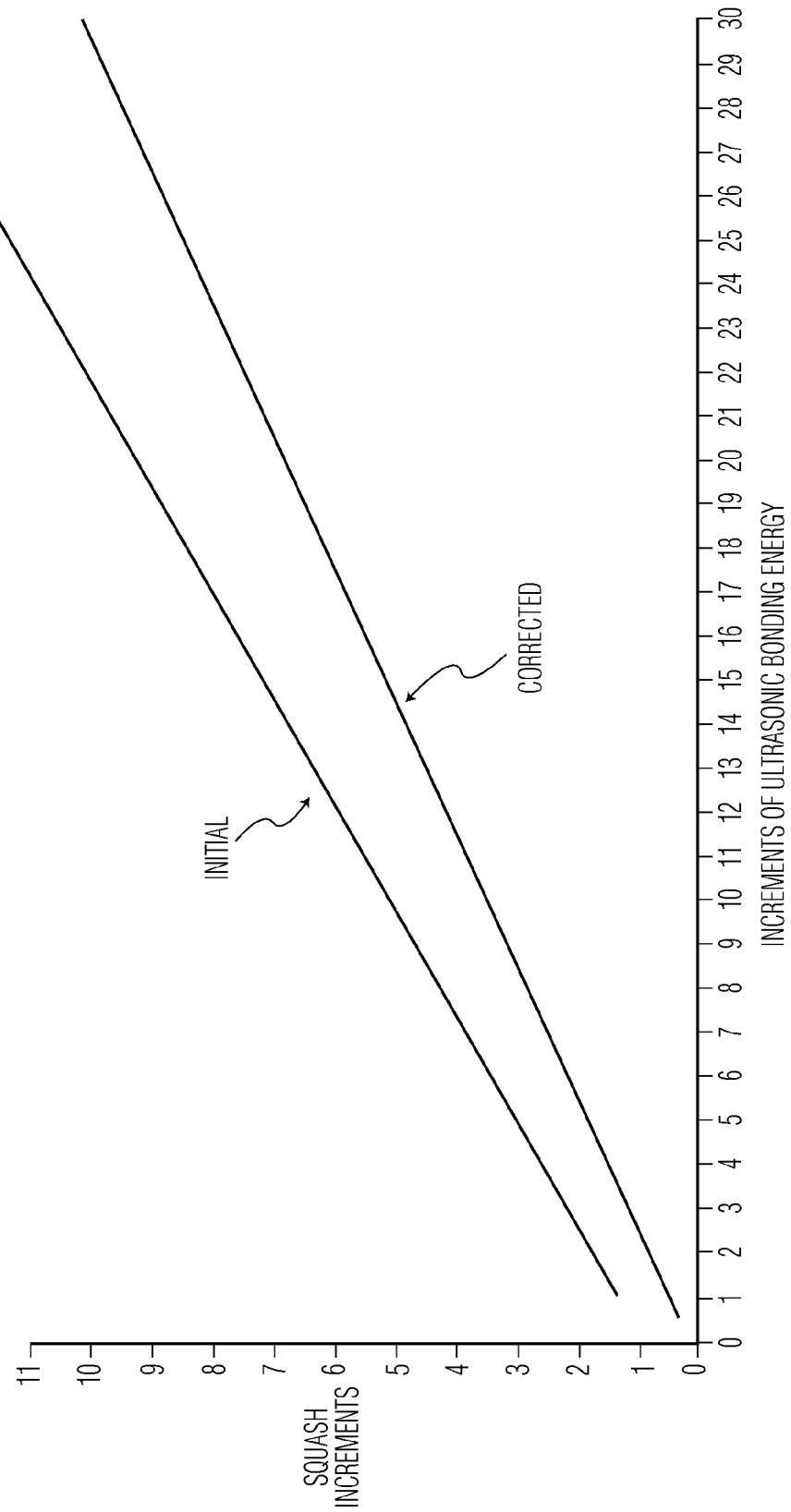
FIG. 5 is a graph of an initial actual relationship between squash increments versus increments of ultrasonic bonding energy, and a corrected actual relationship in accordance with an exemplary embodiment of the present invention.

Specifically, FIG. 5 illustrates an initial/actual relationship ("INITIAL") of a subject wire bonding machine. This relationship is compared to the reference relationship of FIG. 4 ("DESIRED SLOPE"). One or more ultrasonic bonding energy setting(s) (e.g., an electrical current factor of the current to be applied to the ultrasonic transducer, an electrical voltage factor of the voltage to be applied to the ultrasonic transducer, an offset between the actual relationship ("INITIAL") and the reference relationship ("DESIRED SLOPE"), etc.) of the subject wire bonding machine is adjusted such that the adjusted, or corrected, actual relationship ("CORRECTED") of the subject wire bonding machine is closer to the reference relationship. Thus, FIG. 5 illustrates a "CORRECTED" (i.e., adjusted) relationship which is closer to the reference relationship of FIG. 4 ("DESIRED SLOPE") (i.e., the corrected relationship is closer to the reference relationship than the initial relationship is to the reference relationship). The adjustment of the actual relationship of the subject wire bonding machine may be repeated, using the same ultrasonic bonding energy setting (or using a different or additional ultrasonic bonding energy setting(s)), as needed until the corrected actual relationship is within a predetermined tolerance of the reference relationship.

As will be appreciated by those skilled in the art, certain factors are desirably kept the same (or substantially similar) between the wire bonding machines used to establish the reference relationship and the subject wire bonding machines. For example, temperature (e.g., as provided by a heat block), capillary type, wire type, etc.

The adjustment process described herein may be repeated for an entire set of like wire bonding machines at a factory, for example, so that each of the wire bonding machines are adjusted to form like wire bonds having similar characteristics. The process may be performed manually, for example, through operator intervention. However, the process may be performed automatically. For example, the reference relationship (and associated predetermined tolerance) may be integrated into a computer system whereby the process of adjusting a subject relationship may be performed in conjunction with a computer program or algorithm with access to the reference relationship. In a more specific example, the reference relationship and the computer program may be included on each of the subject wire bonding machines to be adjusted.

Figure 6:
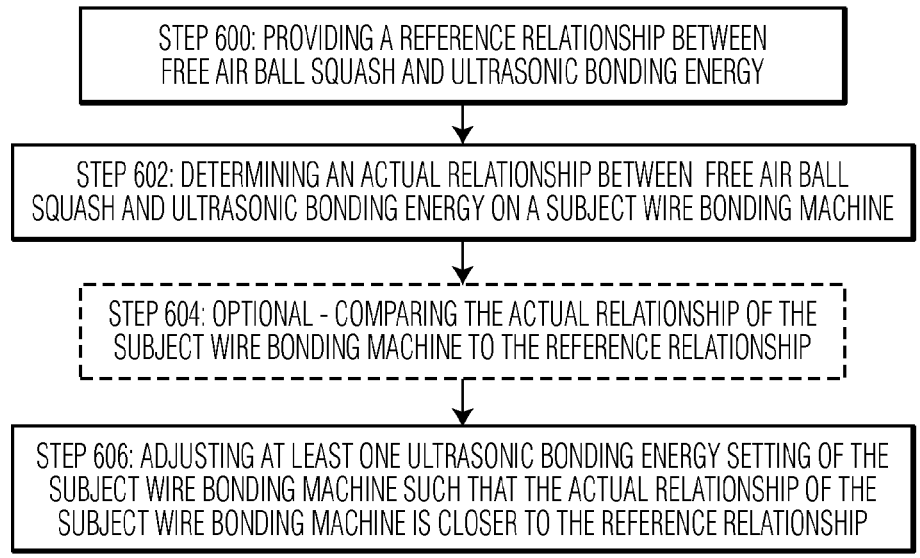
FIG. 6 is a flow diagram illustrating a method of adjusting ultrasonic bonding energy on a subject wire bonding machine in accordance with an exemplary embodiment of the present invention.

FIG. 6 is a flow chart illustrating a method of adjusting ultrasonic bonding energy on a wire bonding energy in accordance with certain exemplary embodiments of the present invention. At Step 600, a reference relationship between free air ball squash and ultrasonic bonding energy is provided (e.g., see the discussion above for FIGS. 2 and 3). At Step 602, an actual relationship between free air ball squash and ultrasonic bonding energy on a subject wire bonding machine is determined. At Step 604, in an optional step, the actual relationship of the subject wire bonding machine is compared to the reference relationship. Then at Step 606, at least one ultrasonic bonding energy setting of the subject wire bonding machine is adjusted such that the actual relationship of the subject wire bonding machine is closer to the reference relationship.

Figure 7:
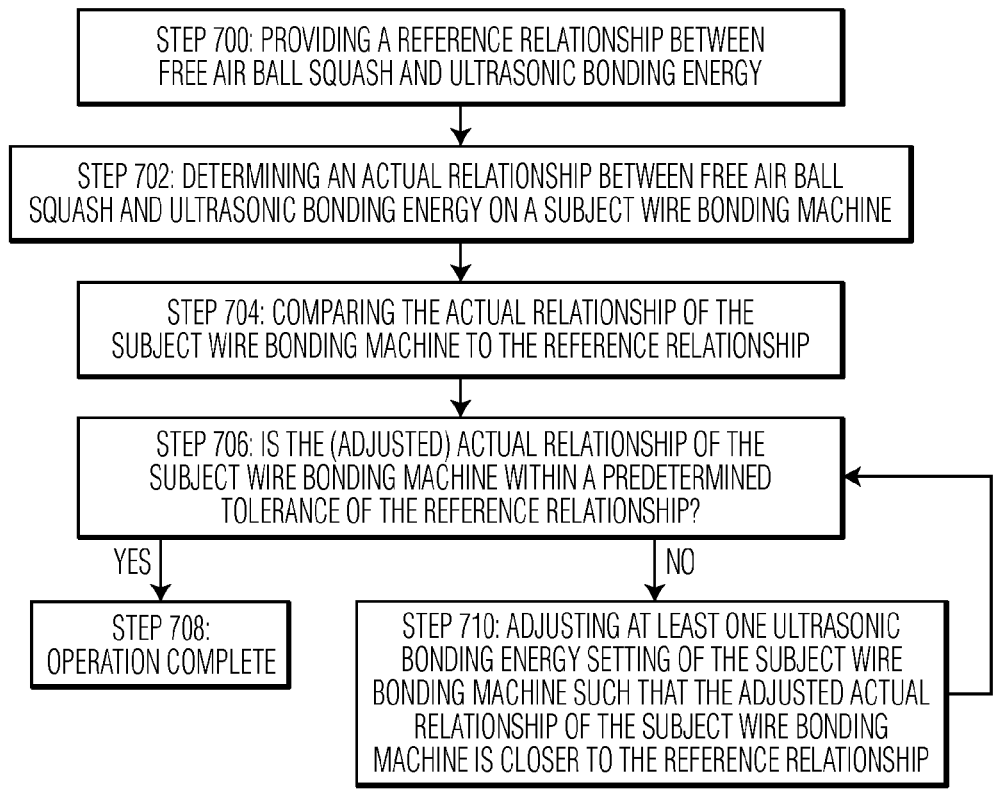
FIG. 7 is a flow diagram illustrating another exemplary method of adjusting ultrasonic bonding energy on a subject wire bonding machine in accordance with an exemplary embodiment of the present invention.

FIG. 7 is a flow chart illustrating another method of adjusting ultrasonic bonding energy on a wire bonding machine in accordance with certain exemplary embodiments of the present invention. At Step 700 a reference relationship between free air ball squash and ultrasonic bonding energy is provided (e.g., see the discussion above for FIGS. 2 and 3). At Step 702, an actual relationship between free air ball squash and ultrasonic bonding energy on a subject wire bonding machine is determined. At Step 704, the actual relationship of the subject wire bonding machine is compared to the reference relationship. At Step 706, it is determined whether the (adjusted) actual relationship of the subject wire bonding machine is within a predetermined tolerance of the reference relationship. For example, such a determination may be achieved using an algorithm, curve fitting software, amongst other techniques understood by those skilled in the art. If the answer is yes, one proceeds to Step 708 and the operation is complete. If the answer is no, then one proceeds to Step 710 where at least one ultrasonic bonding energy setting of the subject wire bonding machine is adjusted such that the adjusted relationship of the subject wire bonding machine is closer to the reference relationship. The method then loops back to Step 706 until the adjusted actual relationship is within a predetermined tolerance of the reference relationship. It is noted that Steps 706 and 710 may be repeated in a closed loop until the adjusted actual relationship is within a predetermined tolerance of the reference relationship and the method proceeds to Step 708 (operation complete), or until Step 706 and 710 have been repeated a predetermined number of times, or for a period of predetermined time.

Figure 8:
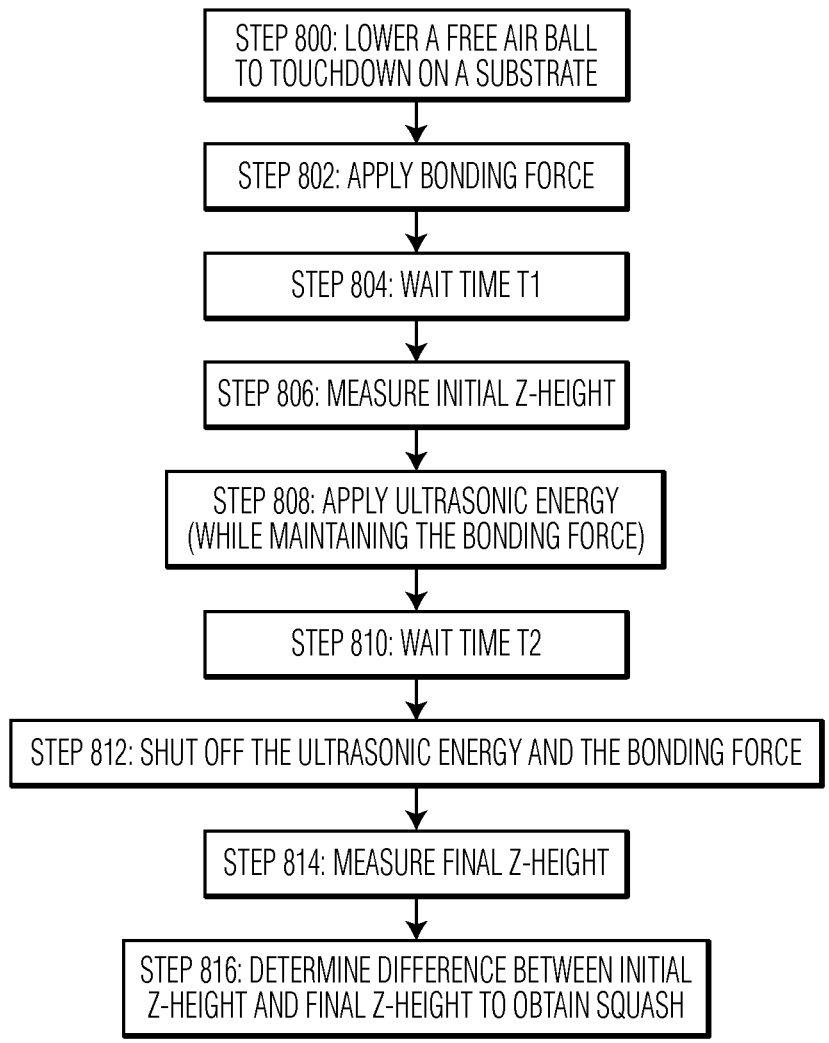
FIG. 8 is a flow diagram illustrating a method of measuring free air ball squash in accordance with an exemplary embodiment of the present invention.

FIG. 8 is a flow diagram illustrating an exemplary method of measuring free air ball squash. Specifically, it describes the process as illustrated in FIGS. 1-2. At Step 800, a free air ball is lowered to touchdown on a bonding location (e.g., a substrate such as a die pad). At Step 802, a bonding force is applied. At Step 804, a time T1 passes. Then, at Step 806, an initial Z-height is measured (e.g., of the capillary or other portion of the bond head of the wire bonding machine). At Step 808, a predetermined level of ultrasonic energy is applied (e.g., while maintaining the bonding force). At Step 810, a time T2 passes. Then, at Step 812, the ultrasonic energy and the bonding force are shut off. At Step 814, the Z-height is measured again (the final Z-height). At Step 816, the difference between the initial Z-height (at Step 806) and the final Z-height (at Step 814) is determined to obtain the squash at the corresponding ultrasonic bonding energy increment. As provided above, this process (or other squash measurement processes) may be repeated for a number of ultrasonic bonding energy increments (e.g., and bonding force increments) in order to derive a relationship for the particular wire bonding machine. Such a process may be used in establishing a reference relationship (in connection with one or more wire bonding machines) or in connection with an actual relationship of a subject wire bonding machine to be adjusted.

While the relationships between free air ball squash and ultrasonic bonding energy (e.g., reference or actual relationships) are illustrated herein as lines, and more particularly, slopes of linear relationships, such relationships may take other forms. For example, the relationships may be provided as a curve, a series of numbers, a plurality of data points, a mathematical expression, or other forms.

The squash values described herein (e.g., for establishing the reference relationship, for establishing an actual relationship of an actual wire bonding machine, etc.) may be determined at a single location on the various wire bonding machines. Conversely, the determinations (and associated adjustments) of squash may be accomplished at different locations on a reference or subject wire bonding machine which may have varying influences. For example, the determinations (and associated adjustments) of squash may be done in four, or more, bonding directions to account for such variations.

As will be appreciated by those skilled in the art, an adjustment(s) to an ultrasonic bonding energy setting(s) in accordance with the present invention may desirably change, for example, the slope of the actual relationship of a subject wire bonding machine to be closer to the slope of a reference relationship. After the slope of the actual relationship has been changed (e.g., to be within a predetermined tolerance of the slope of the reference relationship) a further determination may be made as to whether an offset between the reference relationship and the adjusted actual relationship is within an acceptable tolerance. If the offset between the two relationships (e.g., between the two lines) is not within an acceptable tolerance another adjustment (e.g., a bond force adjustment) may be made to change the offset.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of adjusting ultrasonic bonding energy on a wire bonding machine, the method comprising the steps of:
   a) providing a reference relationship between increments of free air ball squash versus increments of ultrasonic bonding energy;
   b) determining an actual relationship between increments of free air ball squash versus increments of ultrasonic bonding energy on a subject wire bonding machine; and
   c) adjusting at least one ultrasonic bonding energy setting of the subject wire bonding machine such that an adjusted actual relationship between increments of free air ball squash versus increments of ultrasonic bonding energy of the subject wire bonding machine is closer to the reference relationship.

2. The method of claim 1 wherein a plurality of reference wire bonding machines are used to provide the reference relationship between increments of free air ball squash versus increments of ultrasonic bonding energy in step a).

3. The method of claim 1 wherein the reference relationship of step a) relates to respective free air ball squash at each of a plurality of values of the ultrasonic bonding energy.

4. The method of claim 1 wherein the reference relationship of step a) relates to respective free air ball squash at each of a plurality of values of ultrasonic bonding energy on each of a plurality of wire bonding machines.

5. The method of claim 4 wherein the reference relationship is obtained by averaging the respective free air ball squash for each of the plurality of wire bonding machines at each of the plurality of values of the ultrasonic bonding energy.

6. The method of claim 1 wherein steps b) and c) are repeated until the actual relationship is within a predetermined tolerance of the reference relationship.

7. The method of claim 1 wherein steps b) and c) are repeated for a plurality of additional subject wire bonding machines.

8. The method of claim 1 wherein the free air ball squash in step b) corresponds to z-axis motions of a bonding tool of the subject wire bonding machine.

9. The method of claim 1 wherein the free air ball squash in step b) is determined using a z-axis encoder of the subject wire bonding machine.

10. The method of claim 1 wherein the adjusting of the at least one ultrasonic bonding energy setting of the subject wire bonding machine of step c) is a manual adjustment.

11. The method of claim 1 wherein the adjusting of the at least one ultrasonic bonding energy setting of the subject wire bonding machine of step c) is an automated adjustment.

12. The method of claim 11 where steps b) and c) are performed in a closed loop.

13. The method of claim 1 wherein at least 1000 data points are used to establish the provided reference relationship between the increments of free air ball squash versus increments of the ultrasonic bonding energy of step a).

14. The method of claim 1 wherein the at least one ultrasonic bonding energy setting adjusted in step c) is an electrical current factor setting of an ultrasonic transducer.

15. The method of claim 1 wherein the at least one ultrasonic bonding energy setting adjusted in step c) is an electrical voltage factor setting of an ultrasonic transducer.

16. The method of claim 1 wherein the at least one ultrasonic bonding energy setting adjusted in step c) is an offset between the actual relationship and the reference relationship.

17. The method of claim 1 further comprising a step of comparing the actual relationship determined in step b) to the reference relationship provided in step a).

18. The method of claim 1 wherein the actual relationship of the subject wire bonding machine is a substantially linear relationship, and wherein the adjustment of the at least one ultrasonic bonding energy setting of step c) results in a change of a slope of the actual relationship of the subject wire bonding machine.

19. The method of claim 1 wherein the actual relationship and the reference relationship are substantially linear relationships.

20. The method of claim 19 wherein the adjustment of the at least one ultrasonic bonding energy setting of step c) results in a change of a slope of the actual relationship of the subject wire bonding machine.

21. The method of claim 20 further comprising a step of d) determining if (i) an offset between the actual relationship after step c), and (ii) the reference relationship, is within a predetermined tolerance.

* * * * *